(12) United States Patent
Schuler-Watkins et al.

(10) Patent No.: US 11,370,654 B2
(45) Date of Patent: Jun. 28, 2022

(54) DEVICE FOR PROTECTING COMPONENTS AGAINST LIQUIDS AND FOR VENTILATING THE SAME

(71) Applicant: Robert Bosch GmbH, Stuttgart (DE)

(72) Inventors: Sebastian Schuler-Watkins, Herrenberg (DE); Daniel Haug, Neuffen (DE); Michael Knauss, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 361 days.

(21) Appl. No.: 16/616,561

(22) PCT Filed: May 24, 2018

(86) PCT No.: PCT/EP2018/063628
§ 371 (c)(1),
(2) Date: Nov. 25, 2019

(87) PCT Pub. No.: WO2018/219768
PCT Pub. Date: Dec. 6, 2018

(65) Prior Publication Data
US 2020/0087140 A1    Mar. 19, 2020

(30) Foreign Application Priority Data
Jun. 1, 2017  (DE) .......................... 102017209313.7

(51) Int. Cl.
*H01L 29/82* (2006.01)
*B81B 7/00* (2006.01)
*H04R 1/08* (2006.01)

(52) U.S. Cl.
CPC ........... *B81B 7/0061* (2013.01); *H04R 1/086* (2013.01)

(58) Field of Classification Search
CPC .............................. H04R 1/086; B81B 7/0061
See application file for complete search history.

(56) References Cited

U.S. PATENT DOCUMENTS

| 3,789,166 A | 1/1974 | Sebesta | |
| 2017/0265013 A1* | 9/2017 | Zou .................... | H04R 31/003 |
| 2018/0063634 A1* | 3/2018 | Dave ................... | H04R 1/2849 |

FOREIGN PATENT DOCUMENTS

| DE | 102004036035 A1 | 7/2005 |
| EP | 1884695 A1 | 2/2008 |
| FR | 2551172 A1 | 3/1985 |
| WO | 2011114188 A1 | 9/2011 |

OTHER PUBLICATIONS

International Search Report for PCT/EP2018/063628, dated Aug. 9, 2018.

* cited by examiner

*Primary Examiner* — Samuel A Gebremariam
(74) *Attorney, Agent, or Firm* — Norton Rose Fulbright US LLP; Gerard Messina

(57) ABSTRACT

A device is described for protecting components, housings and the like against liquids and for ventilating the same, including at least one first layer, the first layer being configured as a diaphragm and this has a first area in such a way that the first area is configured as gas-permeable and liquid-tight below a first liquid pressure, and at least one second layer, the second layer being connected pressure-tight at least in part to the first layer, and having a second area that is configured in such a way that the first area and the second area interact for sealing against a liquid at a liquid pressure greater than or equal to the first liquid pressure.

13 Claims, 2 Drawing Sheets

DEVICE FOR PROTECTING COMPONENTS AGAINST LIQUIDS AND FOR VENTILATING THE SAME

FIELD

The present invention relates to a device for protecting components against liquids and for ventilating the same. The present invention also relates to a method for protecting components against liquids and for ventilating the same. Although applicable for any liquids, the present invention is explained with respect to the liquid 'water'.

BACKGROUND INFORMATION

Conventional air-permeable, watertight diaphragms are limited to pressure ranges below a certain maximum pressure. After reaching the maximum pressure, the diaphragm becomes permeable and water penetrates. Such diaphragms are used in textiles, and also in technology, among other places. Water-resistant diaphragms are used there in order to ventilate housings including electronic switches or circuit boards, and to simultaneously protect the same against penetration by water.

In one specific embodiment, the present invention provides a device for protecting components, housings, and the like against liquids and for ventilating the same, the device including at least one first layer, the first layer being configured as a diaphragm and this having a first area in such a way that the first area is configured to be gas-permeable and liquid-tight below a first liquid pressure, and at least one second layer, the second layer being connected pressure-tight at least in areas to the first layer and having a second area that is configured in such a way that the first area and the second area interact for sealing against a liquid at a liquid pressure greater than or equal to the first liquid pressure.

In another specific embodiment, the present invention provides a method for protecting components, housings, and the like against liquids and for ventilating the same, a first area of a first layer, configured as a diaphragm, which is connected pressure-tight at least in areas to a second layer, being configured as gas-permeable and liquid-tight below a first liquid pressure, interacts with a second area of the second layer at a liquid pressure greater than or equal to the first liquid pressure to seal against the liquid.

In another specific embodiment, the present invention provides a method for manufacturing a device including the steps:
 manufacturing the first layer,
 manufacturing the second layer,
 partial fixing of the two layers on one another with the aid of a laminating method and/or a bonding method and/or with the aid of welding.

In other words, an example device having at least two layers is provided, which ensures a permanent water-tightness, in that the porous area of the first layer is pressed onto the second area at an increase of the pressure of the liquid, and thus a liquid-tightness is ensured before the porous area is permeable for liquids due to the pressure.

One of the advantages achieved thereby is that, in addition to the ventilation of a component, a permanent tightness is ensured against liquids across a large pressure range. Until a first critical pressure is reached, the first area is permeable for gases and tight against liquids. A component or housing situated beneath this may thus be ventilated. Upon reaching the critical pressure, the device is then permanently tight against liquids, in that the first area and second area are pressed on or onto each other, and thus the component lying underneath is sealed against liquids.

Additional advantages, refinements, and specific embodiments of the present invention are subsequently described or become thereby apparent.

According to one advantageous refinement of the present invention, the first layer is configured to be elastically deformable, in particular reversibly elastically deformable, in areas which are not connected to the second layer. In this way, the first layer may adjust in an easy way to an external liquid pressure, and, upon reaching the critical pressure, provide a seal against a liquid by interacting with the second area.

According to another advantageous refinement of the present invention, the second area has a planar surface. One of the advantages achieved thereby is that the second area may be manufactured particularly easily and cost-efficiently.

According to another advantageous refinement of the present invention, the second area has elevations, whose spacing from each other is greater than the diameter of the first area and which are situated with respect to the first area in such a way that the latter is situated between the elevations at a liquid pressure equal to or above the first liquid pressure. One of the advantages achieved thereby is that an even better seal is achieved. In other words, the already tight area of the first layer, for example, in the form of a diaphragm, seals the second area.

According to another advantageous refinement of the present invention, the elevations are configured for flat contact with the first layer, the diameter of the respective surface of the elevation, in particular, corresponding essentially to at least half of the diameter of the first area. In this way, an extensive sealing of the tight first area of the first layer is possible, and a lower area force is necessary for sealing. The service life of the first layer and of the device as a whole are increased.

According to another advantageous refinement of the present invention, the edges of the elevations are configured as rounded off in the area of contact with the first layer. This likewise increases the service life of the device, as pressing of the edges into the first layer is prevented.

According to another advantageous refinement of the present invention, multiple rows of elevations are situated. This facilitates a particularly reliable seal.

According to another advantageous refinement of the present invention, the first and second area are situated essentially in the center between two areas, in which the two layers are connected to each other, in particular integrally bonded. In this way, a preferably uniform compression of the first layer is facilitated, which increases the service life of the device as a whole.

According to another advantageous refinement of the present invention, the structural design of the second area is adaptable to the material of the first layer. Thus, the flexibility of the device is essentially increased with respect to diverse materials and diverse application areas.

The present invention may likewise be used in the context of micromechanical components, such as micromechanically generated sensor elements for media sensor systems, pressure sensors, gas sensors, moisture sensors, or microphones. For this purpose, the first layer, for example the diaphragm, is generated with the aid of MEMS technologies, such as epitaxial growth, sacrificial layer etching or porous etching of semiconductor substrates, as is described in German Patent Application No. DE 10 2004 036035, among others, about the intermediate production of an n-lattice. In this diaphragm layer, the first area may thereby be treated or structured by an additional micromechanical treatment in such a way that it has the features according to the present invention. Reference is made, for example, to a specific porosity or incorporation of sacrificial layer material into the first layer with subsequent etching out of the sacrificial layer material. The second layer may thereby represent a semiconductor substrate on which the diaphragm layer has been applied. The cavities partially located underneath the diaphragm may likewise be generated with the aid of sacrificial layer technology or the generation of porous semiconductor material with subsequent thermal rearrangement. The structuring of the elevations of the second area or of the elevations may be carried out with the aid of micromechanical technologies. Masking technologies or other micromechanical structuring methods are likewise conceivable in this case.

Other features and advantages of the present invention arise from the figures and the description herein.

It is understood that the previously listed features and the features to be subsequently explained in greater detail, may be used not only in the respectively indicated combination, but also in other combinations or alone, without departing from the scope of the present invention.

Preferred specific embodiments and exemplary embodiments of the present invention are shown in the figures and are subsequently described in greater detail in the description below, the same reference numerals being used for identical or similar or functionally identical components or elements.

BRIEF DESCRIPTION OF THE DRAWINGS

In schematic form and in cross section.

DETAILED DESCRIPTION OF EXAMPLE EMBODIMENTS

Figure 1:
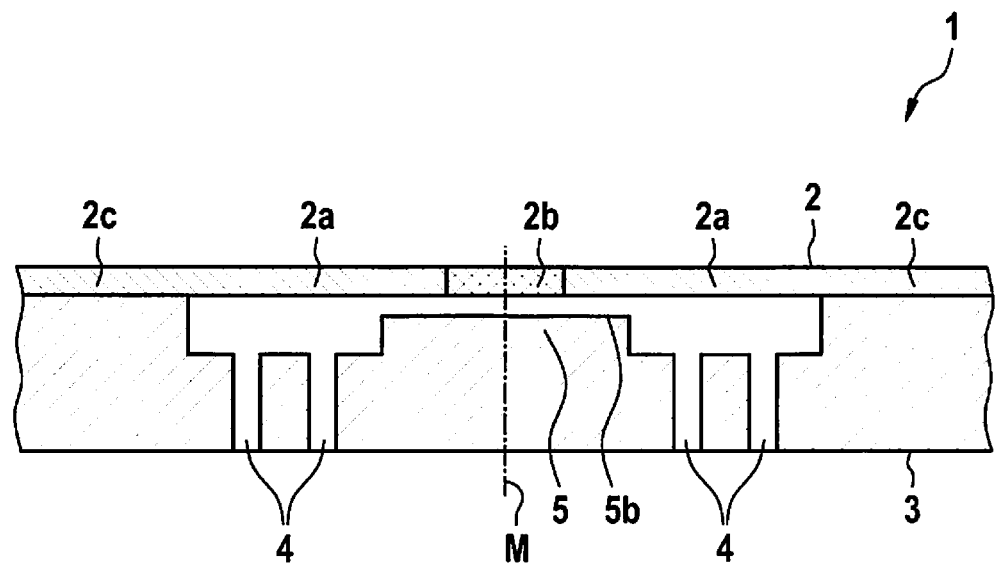
FIG. 1 shows a device according to one first specific embodiment of the present invention.
Figure 2:
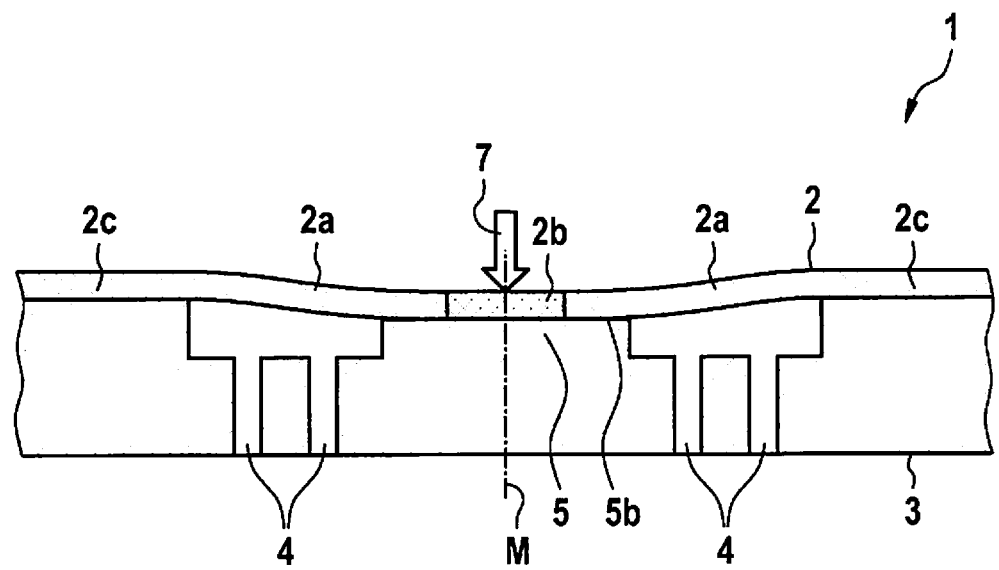
FIG. 2 shows the device according to FIG. 1 when a liquid pressure is applied.

FIG. 1 shows a device according to a first specific embodiment of the present invention and FIG. 2 shows the device according to FIG. 1 when a liquid pressure is applied.

A device 1 is shown in cross section in FIG. 1. Device 1 hereby has a first layer 2 in the form of a diaphragm and a second layer 3 lying underneath. Membrane 2 is fixed at its lateral areas 2c—thus to the left and right in FIG. 1 and FIG. 2—to the surface of second layer 3 with the aid of a laminating method. Membrane 2 is additionally configured to be impermeable to liquid and gas (areas 2a) and has a porous area 2b in its center M, which is configured to be gas permeable.

Second layer 3, which is sealed on its upper side by diaphragm 2, has multiple pressure channels 4 which are connected for pressure/gas exchange for example to a volume situated underneath, for example, a housing, an electronics module, a sensor, a MEMS element or the like. In center M, second layer 3 has a contact area 5 whose surface 5b is configured to be planar and corresponds to porous area 2b of diaphragm 2 or projects laterally beyond porous area 2b, i.e., to the left and right. When a pressure 7 is applied below a critical diaphragm pressure, gasses may pass through porous area 2b of diaphragm 2 so that a pressure compensation may thus be ensured between the upper side of diaphragm 2 and its lower side, i.e., in particular channels 4 in second layer 3. As already explained above, liquids may not penetrate through diaphragm 2, in particular if the pressure is below the critical pressure. The two areas 2b, 5 also do not interact for sealing below the critical pressure, thus, area 2b of the first layer does not contact or does not completely contact area 5 of second layer 3. If, however, pressure 7 on diaphragm 2 is further increased, this diaphragm is stretched, deformed, or pressed in, and, at a critical pressure $P_{KRIT}$, which is lower than the pressure at which diaphragm 2 becomes permeable for liquids, porous area 2b is pressed against second layer 3, in particular its contact area 5, so that porous area 2b of diaphragm 2 seals completely against the penetration of liquid due to the contact at second area 5.

Figure 3:
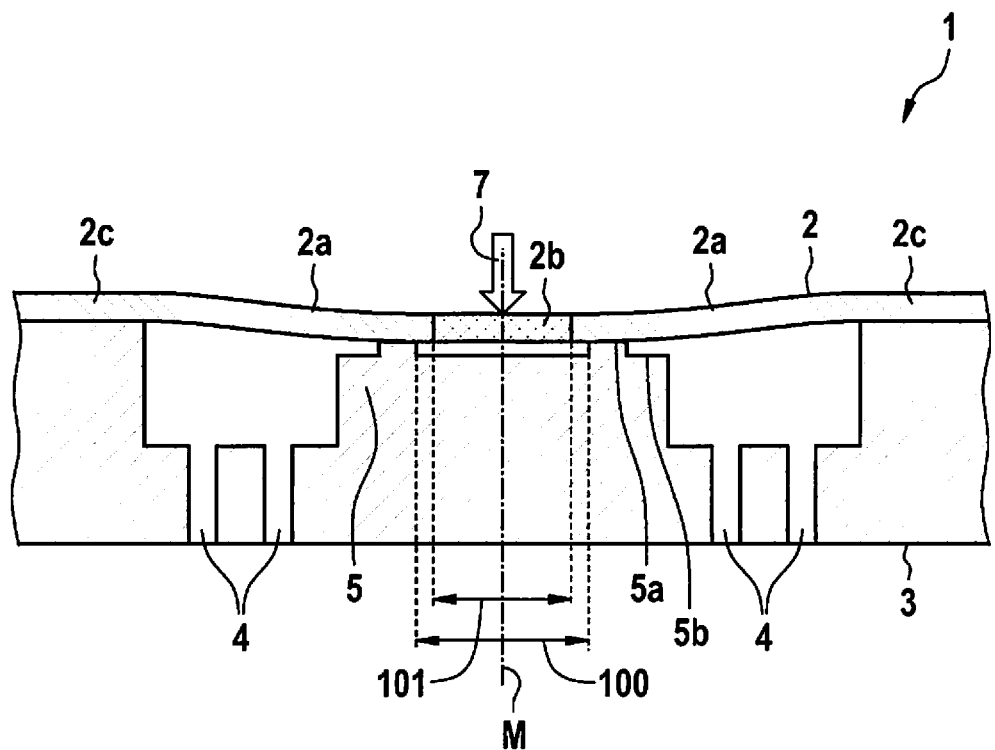
FIG. 3 shows a device according to a second specific embodiment of the present invention.

FIG. 3 shows a device according to a second specific embodiment of the present invention.

FIG. 3 essentially shows a device according to FIGS. 1 and 2. In contrast to device 1 according to FIG. 2, device 1 according to FIG. 3 differs in that contact area 5 of second layer 3 has elevations 5a, whose spacing 100 is larger than diameter 101 of first area 2b of diaphragm 2. The sealing is thus not carried out in porous area 2b of diaphragm 2, but instead in area 2a of already tight diaphragm 2, thus to the left and right of porous area 2b in FIG. 3. Elevations 5a of contact area 5 of second layer 3 are thereby configured in such a way that, as shown in FIG. 3, porous area 2b is pressed between both elevations 5a of contact area 5 of second layer 3 at a correspondingly high, externally applied pressure 7, and thus a seal against liquids and/or gasses is provided.

Figure 4:
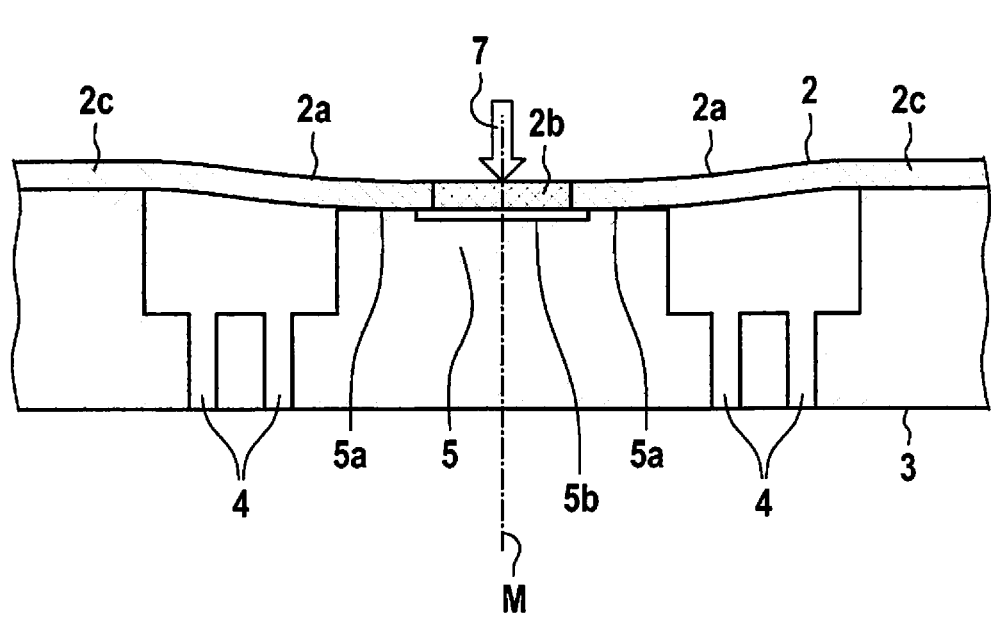
FIG. 4 shows a device according to a third specific embodiment of the present invention.

FIG. 4 shows a device according to a third specific embodiment of the present invention.

FIG. 4 essentially shows a device 1 according to FIG. 3. In contrast to device 1 according to FIG. 3, two elevations 5a are configured to be flat in device 1 according to FIG. 4, so that diaphragm 2 may flatly contact those elevations in its area 2a that is impermeable to liquids and gases. The sealing is thus carried out at an edge and/or on a smaller area of elevations 5a of contact area 5, whereby a smaller area force is necessary for sealing. The so-called dead volume, i.e., the volume underneath porous area 2b of diaphragm 2 between elevations 5a, is preferably configured to be extremely small in order to limit an amount of a liquid penetrating between the elevations. If the liquid pressure is higher, liquid penetrates through porous area 2b and thus between elevations 5a of the second layer. The same pressure presses diaphragm 2 against elevations 5a and seals the area between elevations 5a with respect to channels 4, etc.

In all specific embodiments, edges, on which diaphragm 2 seals, i.e., contacts, may be configured as rounded off in order to prevent the edges from pressing into diaphragm 2. This increases the service life of diaphragm 2 and thus the device as a whole. Elevations 5a are indicated here only by way of example. These may be generally adapted or fixed depending on the material of the diaphragm or of second layer 3. Other structures are also here conceivable, for example, the edges of elevations 5a or of the contact area may be configured to be parabolic, circular, or ellipsoidal as a whole. The elevations may be situated in multiple rows or three-dimensionally in alternating sequence, for example, with interruptions or the like.

In summary, at least one specific embodiment of the present invention has at least one of the following advantages:

reliable sealing of components and/or housings against liquids,
easy manufacturability,
cost-effective manufacturability,
simple implementation,
high service life with a reversibly deformable design,
high flexibility with respect to different application areas, for example, it is suitable for sealing of housings, electronic assemblies, sensors, microphones, and the like, among other things.

Although the present invention has been described with respect to preferred exemplary embodiments, it is not limited to them, but instead may be modified in various ways.

What is claimed is:

1. A device for protecting components and housings against liquids and for ventilating the components and housings, comprising:
   at least one first layer, the first layer being configured as a diaphragm, and having a first area, in such a way that the first area is configured to be gas-permeable and liquid-tight below a first liquid pressure; and
   at least one second layer, the second layer being connected pressure-tight to the first layer at least in areas, and having a second area which is configured in such a way that the first area and the second area interact to seal against liquid at a liquid pressure greater than or equal to the first liquid pressure,
   wherein the second area has elevations whose spacing part from each other is greater than a diameter of the first area and which are situated with respect to the first area in such a way that the first area is situated between the elevations at a liquid pressure equal to or above the first liquid pressure.

2. The device as recited in claim 1, wherein the first layer is reversibly elastically deformable in areas which are not connected to the second layer.

3. The device as recited in claim 1, wherein the second area has a planar surface.

4. The device as recited in claim 1, wherein the elevations are configured for flat contact of the first layer, a diameter of the respective surface of the elevations corresponding to at least half of the diameter of the first area.

5. The device as recited in claim 1, wherein edges of the elevations are configured as rounded off in an area of contact with the first layer.

6. The device as recited in claim 1, wherein the second area has multiple rows of elevations.

7. The device as recited in claim 1, wherein the first area and the second area are situated in a center between two areas in which the first layer and the second layer are connected to each other.

8. The device as recited in claim 7, wherein the two areas are areas in which the first layer and the second layer are integrally bonded to each other.

9. The device as recited in claim 1, wherein a structural design of the second area is adaptable to a material of the first layer.

10. A method for protecting components and housings against liquids and to ventilate the components and housings, comprising:
    interacting, by a first area of a first layer configured as a diaphragm which is connected pressure-tight at least in areas to a second layer, and is configured to be gas-permeable and liquid-tight below a first liquid pressure, with a second area of the second layer to seal against liquid at a liquid pressure greater than or equal to the first liquid pressure,
    wherein the second area has elevations whose spacing part from each other is greater than a diameter of the first area and which are situated with respect to the first area in such a way that the first area is situated between the elevations at a liquid pressure equal to or above the first liquid pressure.

11. A method for manufacturing a device for protecting components and housings against liquids and for ventilating the components and housings, the device including at least one first layer and at least one second layer, the method comprising the following steps:
    manufacturing the first layer;
    manufacturing the second layer; and
    partially fixing the two layers onto each other using a laminating method, and/or a bonding method, and/or welding, and/or a micromechanical application method,
    wherein the first layer is configured as a diaphragm and has a first area in such a way that the first area is configured to be gas-permeable and liquid-tight below a first liquid pressure, and the second layer is configured, which is connected pressure-tight at least in areas to the first layer and has a second area which is configured in such a way that the first area and the second area interact to seal against liquid at a liquid pressure greater than or equal to the first liquid pressure,
    wherein the second area has elevations whose spacing part from each other is greater than a diameter of the first area and which are situated with respect to the first area in such a way that the first area is situated between the elevations at a liquid pressure equal to or above the first liquid pressure.

12. The method as recited in claim 11, wherein the first and/or the second layer are generated using a micromechanical method.

13. The method as recited in claim 11, wherein a cavity is formed between the first layer and the second layer.

* * * * *